(12) United States Patent
Rowell et al.

(10) Patent No.: US 10,684,549 B2
(45) Date of Patent: Jun. 16, 2020

(54) PATTERN-FORMATION METHODS

(71) Applicant: Rohm and Haas Electronic Materials LLC, Marlborough, MA (US)

(72) Inventors: Kevin Rowell, Brighton, MA (US); Cong Liu, Shrewsbury, MA (US); Cheng Bai Xu, Southborough, MA (US); Irvinder Kaur, Northborough, MA (US); Xisen Hou, Lebanon, NH (US); Mingqi Li, Shrewsbury, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 24 days.

(21) Appl. No.: 15/846,658

(22) Filed: Dec. 19, 2017

(65) Prior Publication Data
US 2018/0188654 A1    Jul. 5, 2018

Related U.S. Application Data

(60) Provisional application No. 62/441,250, filed on Dec. 31, 2016.

(51) Int. Cl.
*G03F 7/40* (2006.01)
(52) U.S. Cl.
CPC ..................... *G03F 7/40* (2013.01)
(58) Field of Classification Search
CPC ........................................................ G03F 7/40
See application file for complete search history.

(56) References Cited

U.S. PATENT DOCUMENTS

| | | |
|---|---|---|
| 9,354,523 B2 | 5/2016 | Kiridoshi et al. |
| 2003/0091942 A1 | 5/2003 | Park et al. |
| 2008/0073322 A1 | 3/2008 | Nozaki et al. |
| 2014/0186772 A1 | 7/2014 | Pohlers et al. |
| 2015/0214056 A1 | 7/2015 | Xu et al. |
| 2015/0277228 A1 | 10/2015 | Namiki et al. |

FOREIGN PATENT DOCUMENTS

| | | |
|---|---|---|
| JP | 2015127796 A | 7/2015 |
| JP | 05845556 B2 | 1/2016 |
| JP | 2017219763 A | 12/2017 |

OTHER PUBLICATIONS

Search report for corresponding Taiwan Application No. 106146672 dated Mar. 4, 2019.
Chris A. Mack, "Understanding the efficacy of linewidth roughness postprocessing", J. Micro/Nanolith, MEMS MOEMS, Jul.-Sep. 2015, pp. 033503, vol. 14, No. 3.

*Primary Examiner* — Kathleen Duda
(74) *Attorney, Agent, or Firm* — Jonathan Baskin

(57) ABSTRACT

Pattern-formation methods comprise: (a) providing a substrate; (b) forming a photoresist pattern over the substrate; (c) applying a pattern treatment composition to the photoresist pattern, the pattern treatment composition comprising a solvent mixture comprising a first organic solvent and a second organic solvent, wherein the first organic solvent has a boiling point that is greater than a boiling point of the second organic solvent, and wherein the first organic solvent has a boiling point of 210° C. or more; and (d) thereafter heating the photoresist pattern. The methods find particular applicability in the manufacture of semiconductor devices.

15 Claims, 2 Drawing Sheets

PATTERN-FORMATION METHODS

This application claims the benefit of priority under 35 U.S.C. § 119(e) to U.S. Provisional Application No. 62/441,250, filed Dec. 31, 2016, the entire contents of which are incorporated herein by reference.

BACKGROUND

The invention relates generally to the manufacture of electronic devices. More specifically, this invention relates to pattern-formation methods useful in the formation of fine lithographic patterns.

In the semiconductor manufacturing industry, photoresist materials are used for transferring an image to one or more underlying layers, such as metal, semiconductor and dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities have been and continue to be developed.

Positive-tone chemically amplified photoresists are conventionally used for high-resolution processing. Such resists typically employ a resin having acid-labile leaving groups and a photoacid generator. Patternwise exposure to activating radiation through a photomask causes the acid generator to form an acid which, during post-exposure baking, causes cleavage of the acid-labile groups in exposed regions of the resin. This creates a difference in solubility characteristics between exposed and unexposed regions of the resist in an aqueous alkaline developer solution. For a positive tone photoresist, exposed regions of the resist are soluble in the aqueous alkaline developer and are removed from the substrate surface, whereas unexposed regions, which are insoluble in the developer, remain after development to form a positive image.

Lithographic scaling has conventionally been achieved by increasing the numerical aperture of the optical exposure equipment and using shorter exposure wavelengths. At present, ArF (193 nm) lithography is the standard for mass production of advanced semiconductor devices. To form finer device geometries than possible with ArF lithography, EUV lithography methods and materials have been and continue to be developed for next-generation devices. A technique to reduce pattern geometry beyond that attainable by direct imaging alone is photoresist pattern trimming (see, e.g., US2014/0186772A1 to Pohlers et al). Pattern trimming processes typically involve contacting a photoresist pattern that includes a polymer having acid labile groups with a composition containing an acid or thermal acid generator. The acid or generated acid causes deprotection reaction in a surface region of the resist pattern, which region is then removed, for example, by contact with a developer solution. The features of the resulting resist pattern are thereby reduced in size as compared with the original resist pattern.

With the reduction in pattern size and resulting device geometries, linewidth roughness (LWR) of the photoresist pattern is becoming an increasingly important source of error in lithographic processing (see, Mack, *Understanding the efficacy of linewidth roughness postprocessing*, J. Micro/Nanolith. MEMS MOEMS, 033503-1 July-September 2015, Vol. 14(3)). As such, it would be desirable to minimize LWR of the formed resist pattern.

There is a need in the art for pattern-formation methods useful in electronic device fabrication that address one or more problems associated with the state of the art.

SUMMARY OF THE INVENTION

In accordance with a first aspect of the invention, pattern-formation methods are provided. The methods comprise: (a) providing a substrate; (b) forming a photoresist pattern over the substrate; (c) applying a pattern treatment composition to the photoresist pattern, the pattern treatment composition comprising a solvent mixture comprising a first organic solvent and a second organic solvent, wherein the first organic solvent has a boiling point that is greater than a boiling point of the second organic solvent, and wherein the first organic solvent has a boiling point of 210° C. or more; and (d) thereafter heating the photoresist pattern.

In accordance with a further aspect of the methods, formation of the photoresist pattern can comprise: (b1) lithographically patterning a photoresist composition layer; and (b2) chemically trimming the lithographically patterned photoresist composition layer.

The terminology used herein is for the purpose of describing particular embodiments only and is not intended to be limiting of the invention. The singular forms "a", "an" and "the" are intended to include singular and plural forms, unless the context indicates otherwise.

DESCRIPTION OF THE DRAWINGS

The present invention will be described with reference to the following drawing, in which like reference numerals denote like features, and in which.

DETAILED DESCRIPTION

Figure 1A:
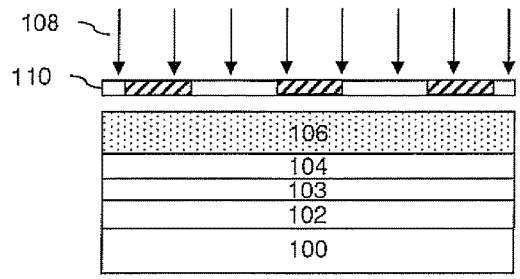
FIG. 1A-G illustrates a first process flow for forming a photolithographic pattern in accordance with the invention.

The pattern-formation methods of the invention comprising: (a) providing a substrate; (b) forming a photoresist pattern over the substrate; (c) applying a pattern treatment composition as described herein to the photoresist pattern; and (d) thereafter heating the photoresist pattern.

Pattern Treatment Compositions

The pattern treatment compositions useful in the methods of the invention comprise a solvent mixture comprising a first organic solvent, a second organic solvent, and one or more optional additional solvents. The solvent mixture is organic solvent-based, typically having an organic solvent content of 90 wt % or more, more typically, 95 wt % or more, 98 wt % or more, 99 wt % or more, or 100 wt %, based on the solvent mixture. The compositions can include one or more additional, optional components. Preferred pattern treatment compositions can result in improved (i.e., reduced) LWR for treated photoresist patterns.

Typical solvent materials useful in the pattern treatment compositions include those which dissolve or disperse optional components, if present, and do not appreciably dissolve an underlying photoresist layer. Preferably, the solvents produce no, or substantially no, intermixing with the underlying photoresist layer.

The first organic solvent (or "additive solvent") has a relatively high boiling point that is greater than a boiling point of the second organic solvent. The first organic solvent has a boiling point of 210° C. or more, for example, from 210° C. to 350° C., more typically from 210° C. to 300° C., from 230° C. to 280° C. or from 240° C. to 280° C. It is typical for the first organic solvent to have a higher boiling point than the other components of the solvent mixture. The desired boiling point of the first organic solvent will depend on the other components of the solvent mixture. The table below provides boiling points for various organic solvents.

| Organic Solvent | BP (° C.) |
| --- | --- |
| Di(ethylene glycol) monoethyl ether | 202 |
| Di(propylene glycol) allyl ether | 213 |
| Di(ethylene glycol) monobutyl ether | 231 |
| Di(propylene glycol) | 232 |
| Tri(propylene glycol) monomethyl ether | 243 |
| Tri(propylene glycol) | 273 |
| Tri(propylene glycol) monobutyl ether | 276 |

Suitable first organic solvents include glycol ethers having a boiling point of 210° C. or more, for example, dipropylene glycol, di(propylene glycol) allyl ether, di(ethylene glycol) monobutyl ether, tripropylene glycol, tri(propylene glycol) monomethyl ether, tri(propylene glycol) monobutyl ether, pentapropylene glycol monomethyl ether, pentapropylene glycol monobutyl ether and combinations thereof. The first organic solvent is preferably present in the pattern treatment compositions in an amount of from 0.001 to 20 wt %, more preferably from 0.01 to 5 wt %, based on the solvent mixture.

The second organic solvent (or "primary solvent") preferably exhibits excellent solubility characteristics with respect to any optional non-solvent components, if present. While the desired boiling point of the second organic solvent will depend on the other component(s) of the solvent mixture, the boiling point is less than that of the first organic solvent, with a boiling point of from 120 to 200° C. being typical. Suitable primary solvents include, for example, dialkyl ethers, preferably those having a total carbon number of from 6 to 16, such as those of the formula $R_1$—O—$R_2$, wherein $R_1$ and $R_2$ are independently chosen from $C_2$ to $C_8$ alkyl. The alkyl ethers groups can be linear or branched, and the ethers can be symmetric or asymmetric. Particularly suitable alkyl ethers include, for example, isobutyl ether, isobutyl isohexyl ether, isoamyl ether and combinations thereof. Suitable primary solvents also include aryl ethers, preferably those having total carbon number of from 6 to 16, such as anisole and ethyl phenyl ether. The primary solvent is typically present in an amount of from 80 to 99.999 wt % based on the solvent mixture.

The solvent mixture can include one or more organic solvent in addition to the first and second organic solvents. Suitable additional solvents include, for example: alcohols such as C4 to C8 n-alcohols, for example, n-butanol, isobutanol, 2-methyl-1-butanol, isopentanol, 2,3-dimethyl-1-butanol, 4-methyl-2-pentanol, isohexanol and isoheptanol; and alkanes such as C8 to C12 n-alkanes, for example, n-octane, n-decane and dodecane; and combinations of any of the foregoing. When used, the optional solvent is typically present in an amount of from 10 to 40 wt % based on the solvent mixture. The additional solvent, if used, should have a boiling point lower than that of the first organic solvent.

Particularly suitable solvent mixtures for the compositions include, without limitation, di(propylene glycol) allyl ether/isoamyl ether, di(propylene glycol) allyl ether/dibutyl ether, di(propylene glycol) allyl ether/Anisole, di(ethylene glycol) butyl ether/isoamyl ether, di(propylene glycol)/isoamyl ether, tri(propylene glycol) monomethyl ether/isoamyl ether, tri(propylene glycol)/isoamyl ether and tri(propylene glycol) butyl ether/isoamyl ether.

The pattern treatment compositions may include other optional additives. Suitable optional additives can include, for example, one or more of a surfactant, an acid, an acid generator such as a thermal acid generator, and a non-surfactant polymer. The compositions can alternatively be free of one or more of surfactants, acids, acid generators or non-surfactant polymers.

Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, polypropylene glycol surfactants and fluorochemical surfactants. Suitable non-ionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly (ethylene glycol-co-propylene glycol), or other surfactants disclosed in McCutcheon's Emulsifiers and Detergents, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL and DYNOL. Additional suitable surfactants include other polymeric compounds such as the tri-block EO-PO-EO co-polymers PLURONIC® 25R2, L121, L123, L31, L81, L101 and P123 (BASF, Inc.). Such surfactants, if used, are typically present in the composition in minor amounts such as from 0.005 to 10 wt %, from 0.01 to 5 wt %, or from 0.05 to 2 wt %, based on the composition.

The pattern treatment compositions can optionally include an acid or an acid generator such as a thermal acid generator (TAG). This may be desired, for example, if it is desired to chemically trim the photoresist pattern to reduce its geometry. In the case of a photoresist based on deprotection reaction, the acid or generated acid with heat can cause cleavage of the bonds of acid labile groups in a surface region of the photoresist pattern, causing increased solubility of the photoresist polymer in an aqueous base rinsing solution such as an aqueous tetramethylammonium hydroxide (TMAH) solution, typically a 0.26N TMAH solution.

The acid may take the form of one or more acid groups (e.g., carboxylic acid or sulfonic acid group) on a polymer, for example, a matrix polymer as described below. Acid group-containing units on a polymer can be present, for example, in an amount of 30 mol % or less, based on the polymer.

Additionally or alternatively, the acid can be in non-polymeric form. Preferable non-polymeric acids are organic acids including both non-aromatic acids and aromatic acids optionally having fluorine substitution. Suitable organic acids include, for example: carboxylic acids and polycarboxylic acids such as alkanoic acids, including formic acid, acetic acid, propionic acid, butyric acid, dichloroacetic acid, trichloroacetic acid, perfluoroacetic acid, perfluorooctanoic acid, oxalic acid malonic acid and succinic acid; hydroxy-alkanoic acids, such as citric acid; aromatic carboxylic acids such as benzoic acid, fluorobenzoic acid, hydroxybenzoic acid and naphthoic acid; organic phosphorus acids such as dimethylphosphoric acid and dimethylphosphinic acid; and sulfonic acids such as optionally fluorinated alkylsulfonic acids including methanesulfonic acid, trifluoromethanesulfonic acid, ethanesulfonic acid, 1-butanesulfonic acid, 1-perfluorobutanesulfonic acid, 1,1,2,2-tetrafluorobutane-1-sulfonic acid, 1,1,2,2-tetrafluoro-4-hydroxybutane-1-sulfonic acid, 1-pentanesulfonic acid, 1-hexanesulfonic acid, 1-heptanesulfonic acid, and the following:

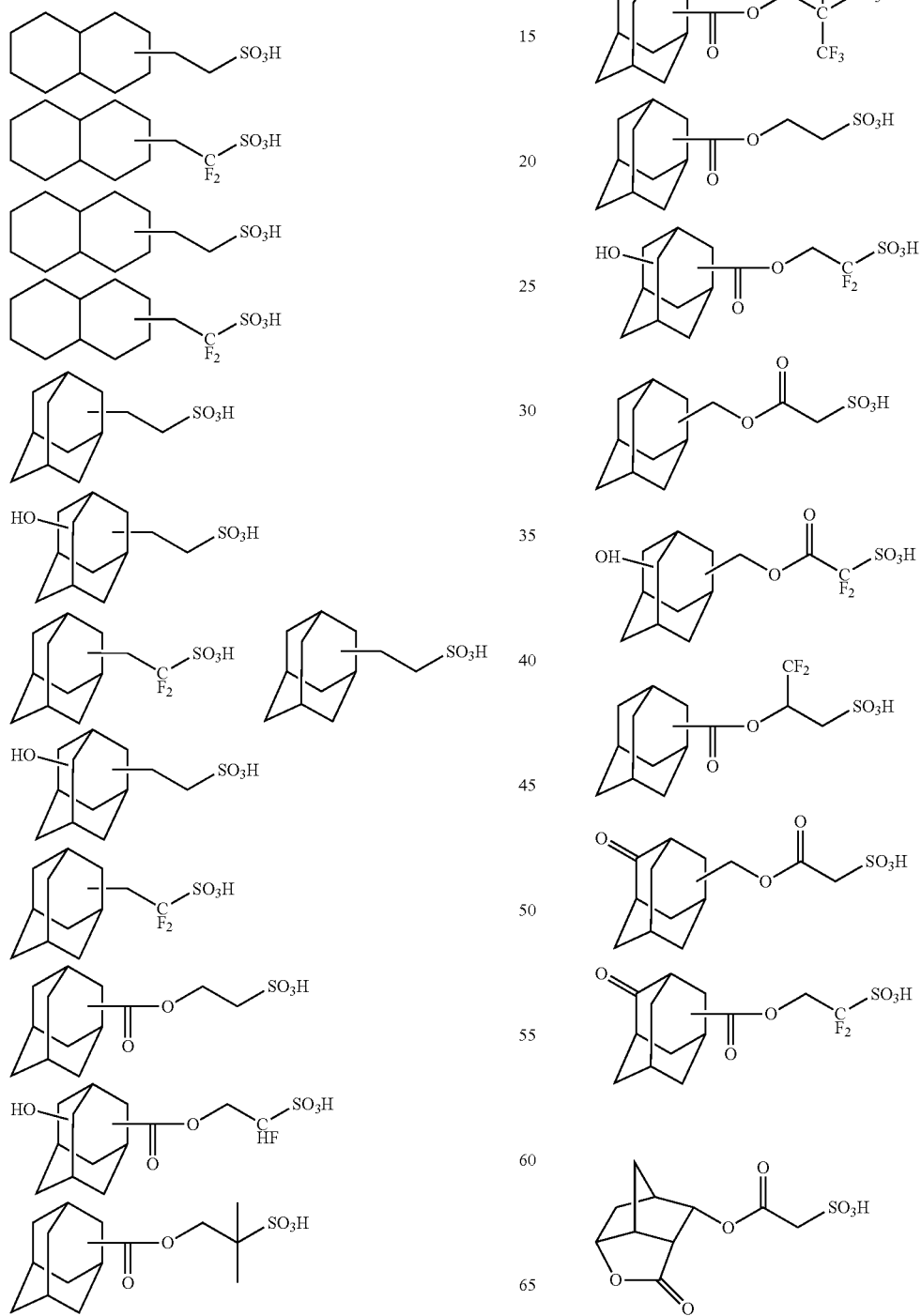

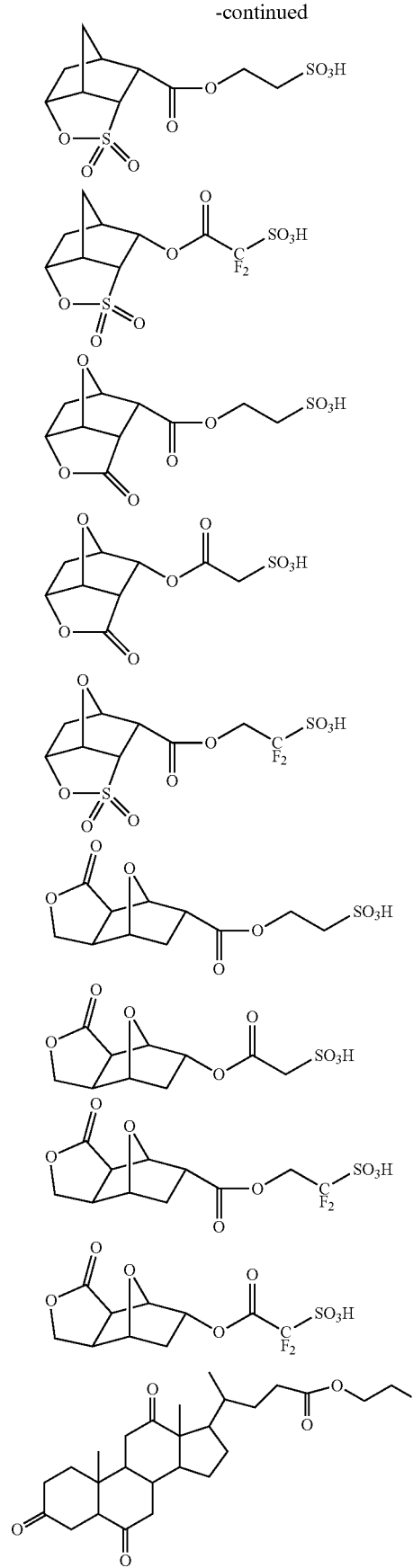
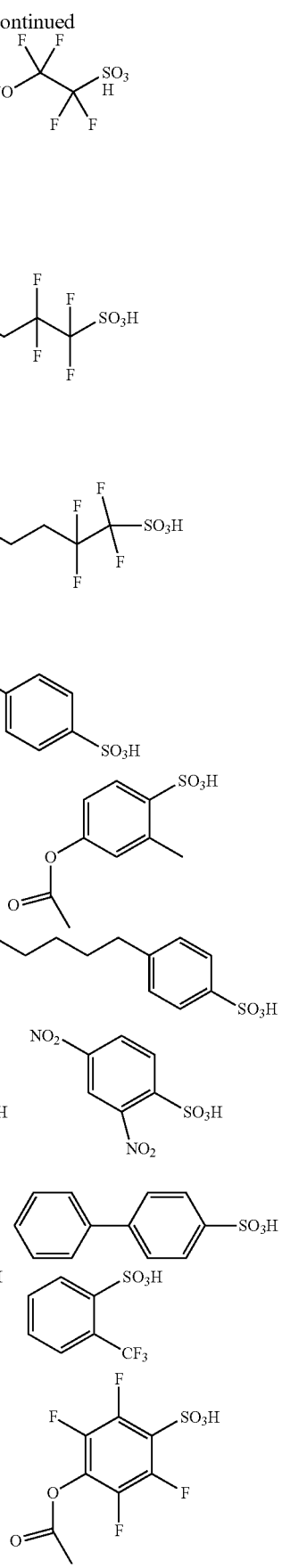

-continued

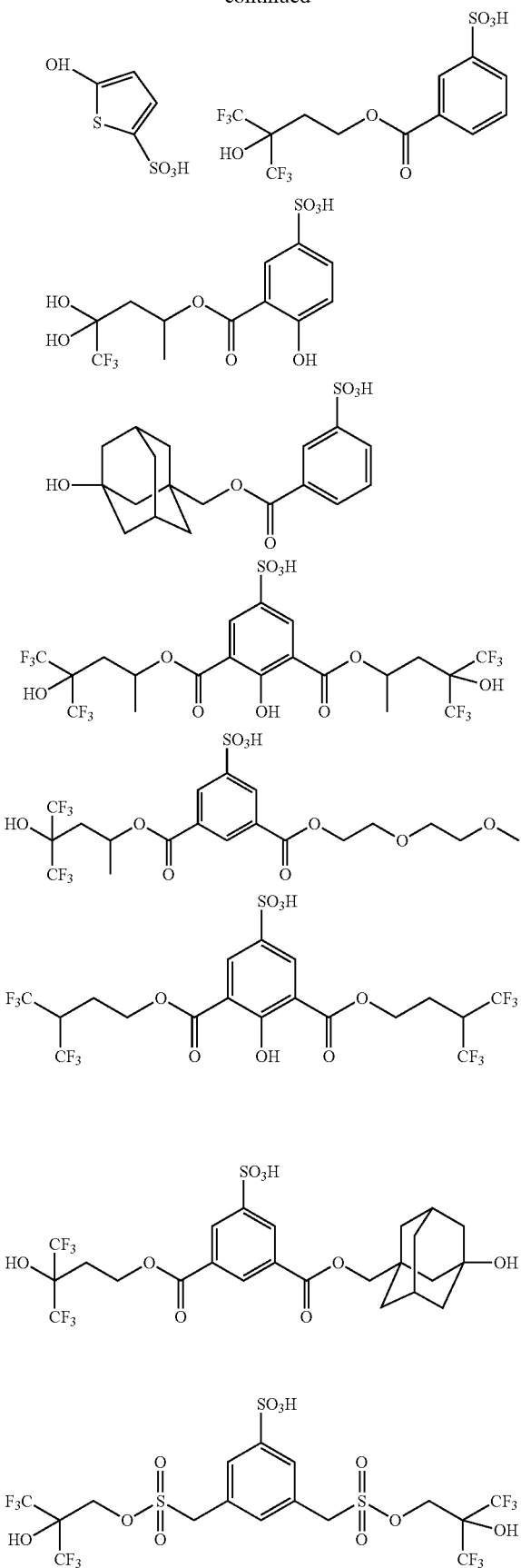

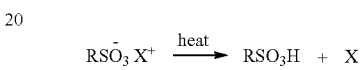

The non-polymeric acid, if used, is typically present in the composition in an amount of from about 0.001 to 1 wt % based on the composition.

Suitable thermal acid generators include those capable of generating the non-polymeric acids described above. The thermal acid generator can be non-ionic or ionic. Preferably, the TAG is ionic with a reaction scheme for generation of a sulfonic acid as shown below:

wherein $RSO_3^-$ is the TAG anion and $X^+$ is the TAG cation, preferably an organic cation. The cation can be a nitrogen-containing cation of the general formula (I):

$$(BH)^+ \qquad (I)$$

which is the monoprotonated form of a nitrogen-containing base B. Suitable nitrogen-containing bases B include, for example: optionally substituted amines such as ammonia, difluoromethylammonia, C1-20 alkyl amines, and C3-30 aryl amines, for example, nitrogen-containing heteroaromatic bases such as pyridine or substituted pyridine (e.g., 3-fluoropyridine), pyrimidine and pyrazine; nitrogen-containing heterocyclic groups, for example, oxazole, oxazoline, or thiazoline. The foregoing nitrogen-containing bases B can be optionally substituted, for example, with one or more group chosen from alkyl, aryl, halogen atom (preferably fluorine), cyano, nitro and alkoxy. Of these, base B is preferably a heteroaromatic base.

Base B typically has a pKa from 0 to 5.0, or between 0 and 4.0, or between 0 and 3.0, or between 1.0 and 3.0. As used herein, the term "$pK_a$" is used in accordance with its art-recognized meaning, that is, $pK_a$ is the negative log (to the base 10) of the dissociation constant of the conjugate acid $(BH)^+$ of the basic moiety (B) in aqueous solution at about room temperature. In certain embodiments, base B has a boiling point less than about 170° C., or less than about 160° C., 150° C., 140° C., 130° C., 120° C., 110° C., 100° C. or 90° C.

Exemplary suitable nitrogen-containing cations $(BH)^+$ include $NH_4^+$, $CF_2HNH_2^+$, $CF_3CH_2NH_3^+$, $(CH_3)_3NH^+$, $(C_2H_5)_3NH^+$, $(CH_3)_2(C_2H_5)NH^+$ and the following:

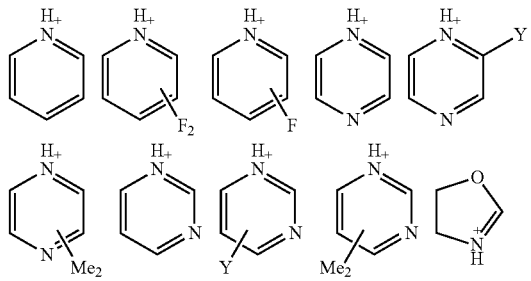

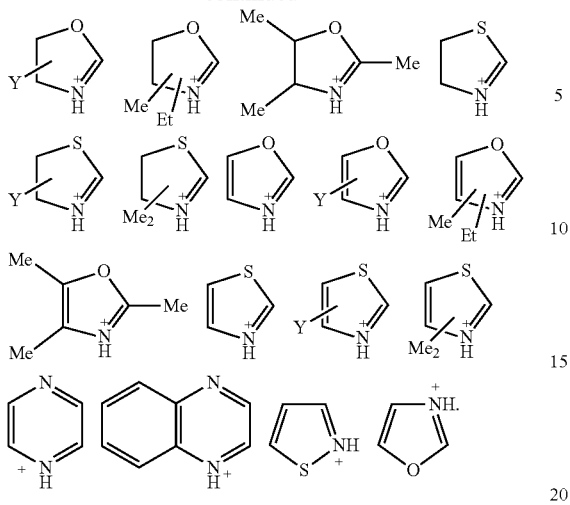

in which Y is alkyl, preferably, methyl or ethyl.

Other suitable cations include onium cations. Suitable onium cations include, for example, sulfonium and iodonium cations, for example, those of the following general formula (II):

wherein X is S or I, wherein when X is I then a is 2, and when X is S then a is 3; $R_1$ is independently chosen from organic groups such as optionally substituted $C_{1-30}$ alkyl, polycyclic or monocyclic $C_{3-30}$ cycloalkyl, polycyclic or monocyclic $C_{6-30}$ aryl, or a combination thereof, wherein when X is S, two of the R groups together optionally form a ring.

Exemplary suitable sulfonium and iodonium cations include the following:

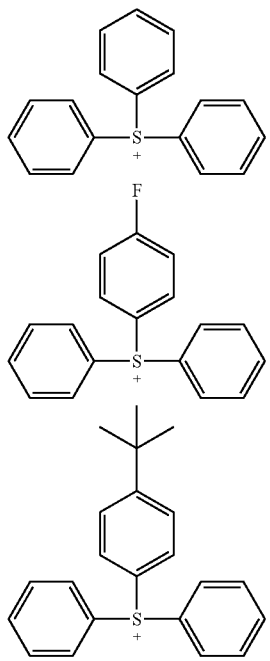

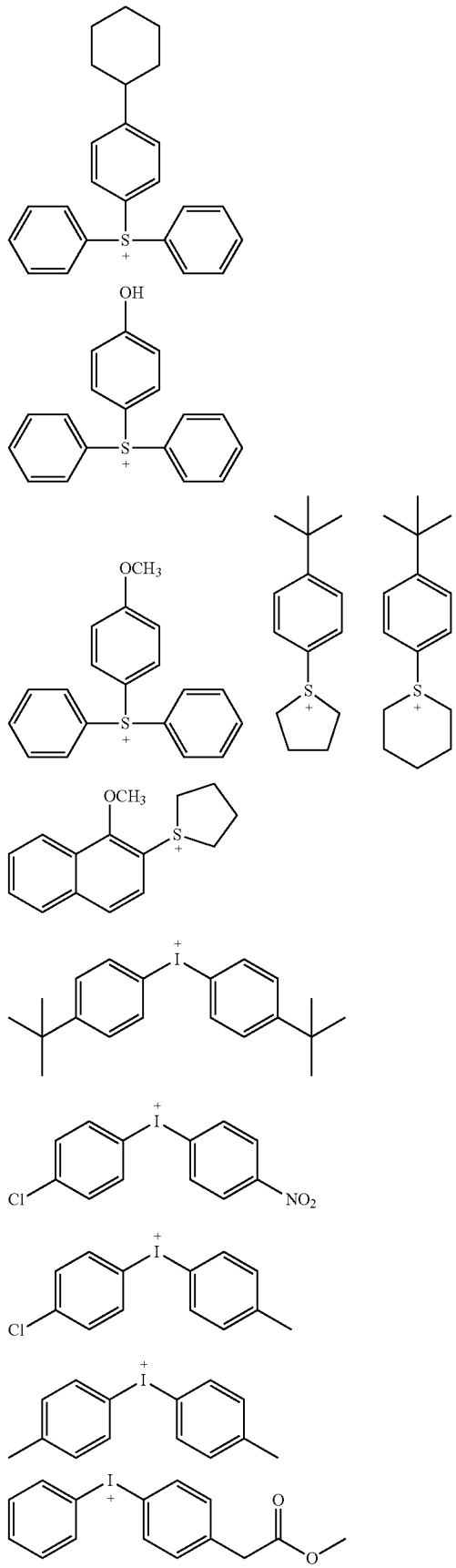

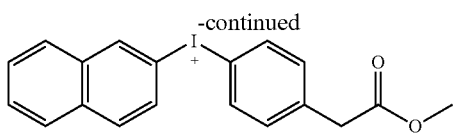

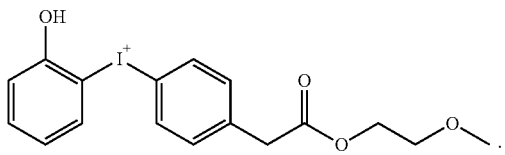

When present, the acid generator is typically present in the composition in an amount of from about 0.001 to 1 wt % based on the composition.

The pattern treatment compositions can optionally include one or more polymers such as a matrix polymer. A matrix polymer can allow for the compositions to be coated over the photoresist pattern in the form of a layer having a desired thickness. The matrix polymer, if used, should have good solubility in a rinsing agent to be used in the process. For example, the polymer can be soluble in an aqueous alkaline solution such as those typically used as photoresist developers, preferably aqueous quaternary ammonium hydroxide solutions such as aqueous tetramethylammonium hydroxide (TMAH) (e.g., a 0.26N TMAH solution). To minimize residue defects originating from the composition, the dissolution rate of a dried layer of the composition in a rinsing agent to be applied should be greater than that of the photoresist pattern surface region in the rinsing agent. The polymer typically exhibits a dissolution rate in the rinsing agent, preferably a 0.26N TMAH solution, of 100 Å/second or higher, preferably 1000 Å/second or higher. The polymer should be soluble in the solvent of the composition, described herein.

The polymer can be formed from one or more monomers chosen, for example, from those having an ethylenically unsaturated polymerizable double bond, such as: (meth) acrylate monomers such as isopropyl(meth)acrylate and n-butyl(meth)acrylate; (meth)acrylic acid; vinyl aromatic monomers such as styrene, hydroxystyrene and acenaphthylene; vinyl alcohol; vinyl chloride; vinyl pyrrolidone; vinyl pyridine; vinyl amine; vinyl acetal; and combinations thereof. Preferably, the matrix polymer contains one or more functional groups chosen, for example, from hydroxyl, carboxyl, sulfonic acid, silanol, sulfonamide, hexafluoroisopropyl alcohol [-C(CF$_3$)$_2$OH], anhydrates, lactones, esters, ethers, allylamine, pyrrolidones and combinations thereof. The matrix polymer can be a homopolymer or a copolymer having a plurality of distinct repeat units, for example, two, three, four or more distinct repeat units. In one aspect, the repeat units of the matrix polymer are all formed from (meth)acrylate monomers, are all formed from (vinyl)aromatic monomers or are all formed from (meth)acrylate monomers and (vinyl)aromatic monomers. When the matrix polymer includes more than one type of repeat unit, it typically takes the form of a random copolymer. Suitable matrix polymers in accordance with the invention include, for example, the following:

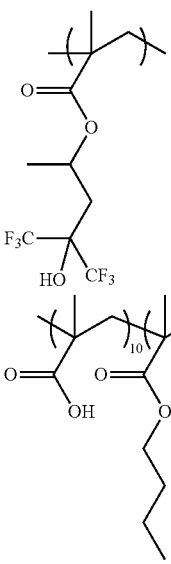
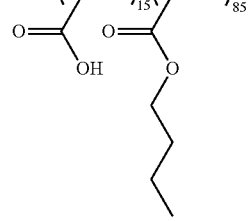
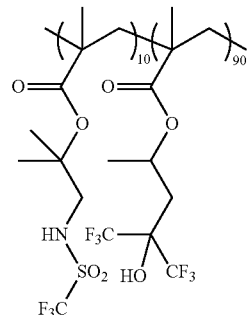
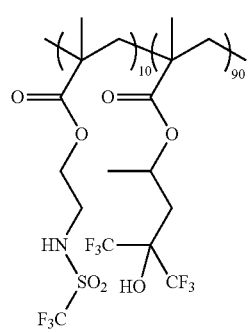
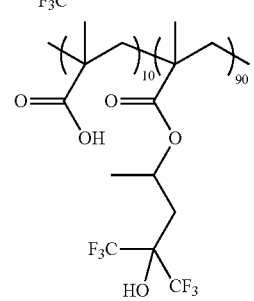
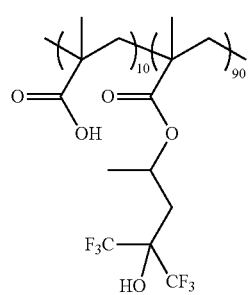
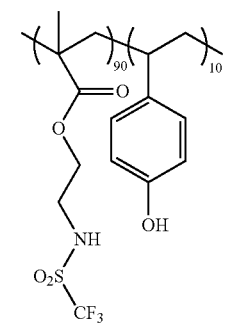
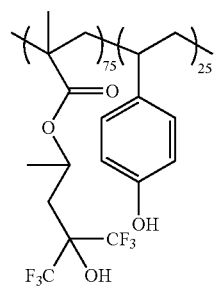
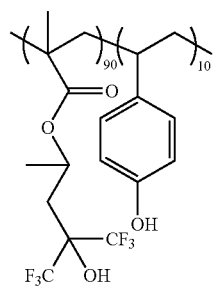

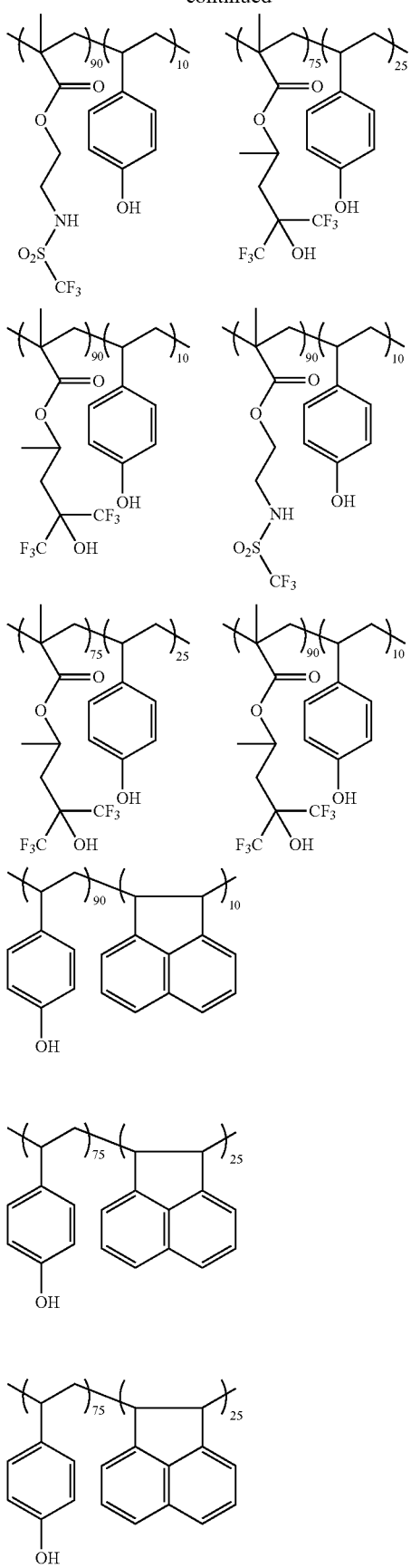
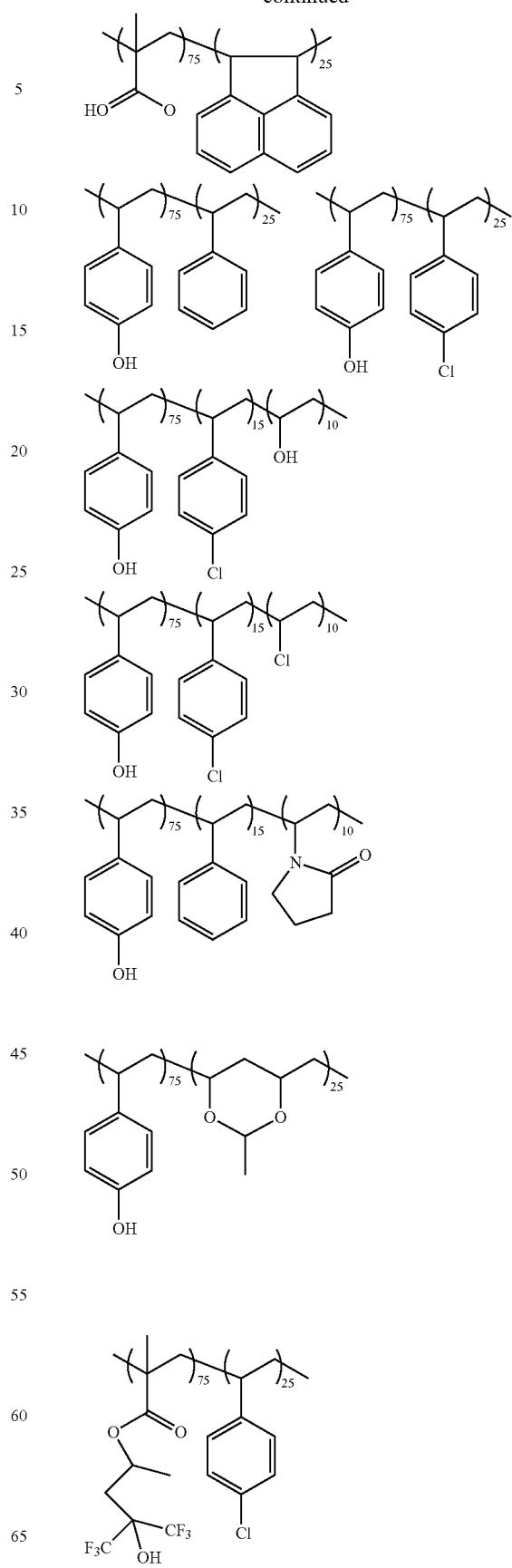

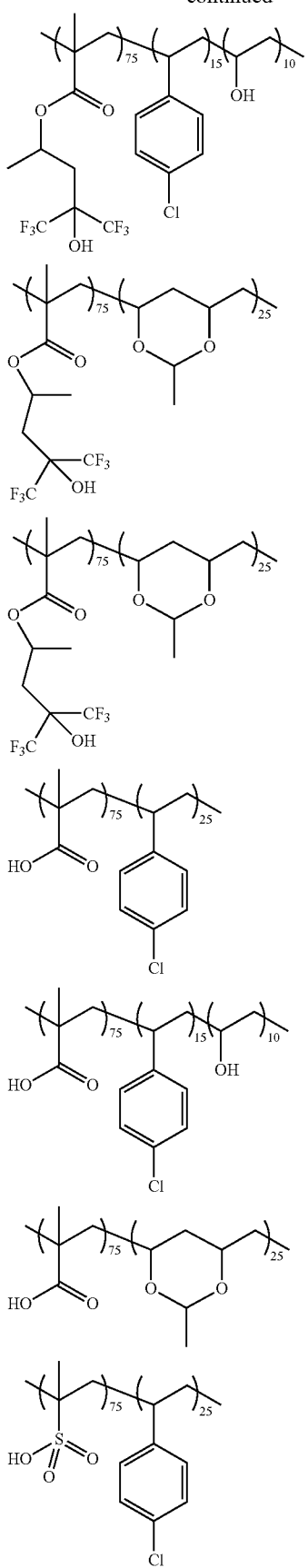
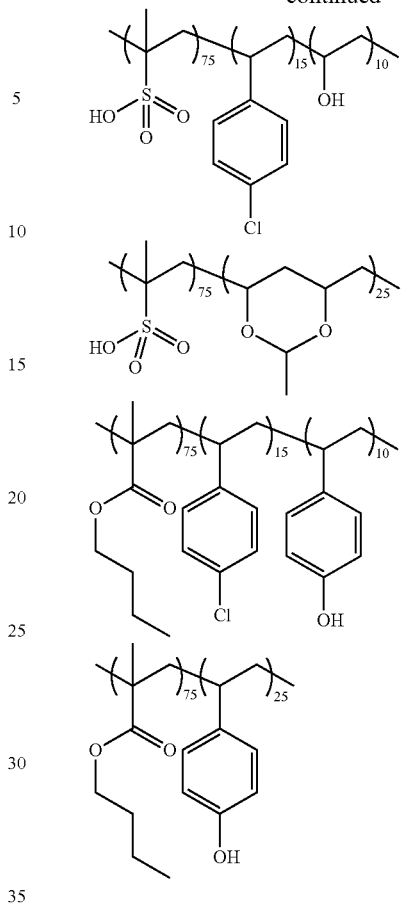

wherein the unit contents are in mol %.

The content of the matrix polymer in the composition will depend, for example, on the target thickness of the layer, with a higher polymer content being used when thicker layer is desired. If used, the matrix polymer is typically present in the pattern treatment composition in an amount of from 80 to 99 wt %, more typically from 90 to 98 wt %, based on total solids of the composition. The weight average molecular weight (Mw) of the matrix polymer is typically less than 400,000, preferably from 3000 to 50,000, more preferably from 3000 to 25,000, as measured by GPC versus polystyrene standards. Typically, the matrix polymer will have a polydispersity index (PDI=Mw/Mn) of 3 or less, preferably 2 or less, as measured by GPC versus polystyrene standards.

Suitable polymers and monomers for use in the compositions are commercially available and/or can readily be made by persons skilled in the art. For example, a matrix polymer may be synthesized by dissolving selected monomers corresponding to units of the polymer in an organic solvent, adding a radical polymerization initiator thereto, and effecting heat polymerization to form the polymer. Examples of suitable organic solvents that can be used for polymerization of the matrix polymer include, for example, toluene, benzene, tetrahydrofuran, diethyl ether and dioxane. Suitable polymerization initiators include, for example, 2,2'-azobisisobutyronitrile (AIBN), 2,2'-azobis(2,4-dimethylvaleronitrile), dimethyl 2,2-azobis(2-methylpropionate), benzoyl peroxide and lauroyl peroxide.

The compositions are preferably free of cross-linking agents as such materials can result in a dimensional increase of the resist pattern.

The pattern treatment compositions useful in the invention may be suitably prepared by combining the solvent components with any additional, optional components. The viscosity of the entire composition is typically from 1.5 to 2 centipoise (cp).

Photoresist Compositions

The pattern-formation methods typically use a photoresist composition layer exposed to activating radiation at a sub-400 nm, sub-300 nm, such as KrF (248 nm), ArF (193 nm) or EUV (e.g. 13.4 or 13.5 nm) wavelength. The photoresist composition is typically chemically amplified. Suitable photoresist compositions are known in the art and commercially available, for example, from Dow Electronic Materials.

Preferred photoresist compositions include a vinyl aromatic-based matrix polymer such as a polyhydroxystyrene-based polymer. Preferred matrix polymers comprise a repeat unit of the following formula (III):

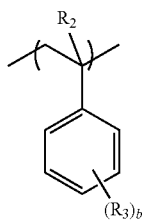

(III)

wherein: $R_2$ is hydrogen or methyl; $R_3$ is one or more groups chosen from hydroxyl, C1-C8 alkoxy, C5-C12 aryloxy, C2-C10 alkoxycarbonyloxy, C1-C4 alkyl, C5-C15 aryl and C6-C20 aralkyl, wherein one or more carbon hydrogens are optionally substituted with a halogen atom; b is an integer of from 1 to 5; wherein at least one $R_3$ is independently chosen from hydroxyl, C1-C8 alkoxy, C5-C12 aryloxy and C2-C10 alkoxycarbonyloxy.

The matrix polymer typically also includes repeat units having an acid labile leaving group, for example units of general formula (IV) in which the hydroxyl moiety of a carboxyl group is substituted with an acid labile group:

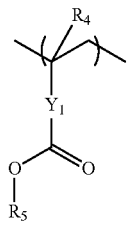

(IV)

wherein: $R_4$ represents hydrogen, C1-C4 alkyl or C1-C4 fluoroalkyl; $R_5$ represents an acid labile group; $Y_1$ is a single bond or a C1-C12 divalent linking group that optionally is halogenated or contains one or more of ester, ether or ketone groups.

Suitable acid labile groups for $R_5$ include, but are not limited to the following:

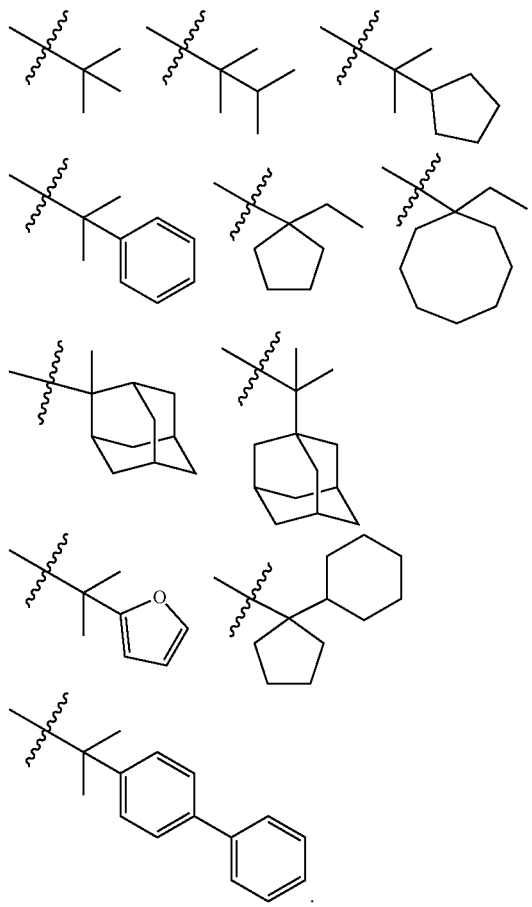

The photoresist matrix polymer may further comprise recurring units of an onium salt photoacid generator. Suitable such units include, for example, those of the general formulae (V) and (VI):

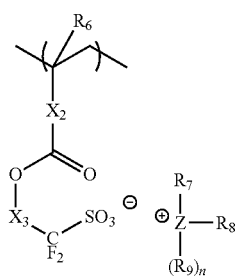

(V)

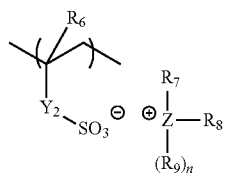

(VI)

In formulae (V) and (VI), $R_6$ represents hydrogen, C1-C4 alkyl or C1-C4 fluoroalkyl; $R_7$, $R_8$ and $R_9$ each independently represents a straight, branched or cyclic C1-C12 alkyl group which may contain a carbonyl, ester or ether substituent, or a C6-C12 aryl group, a C7-C20 aralkyl group or a thiophenyl group; $R_7$ and $R_8$ may connect to form single cyclic or fused cyclic structures; $X_2$ and $X_3$ each independently represent a single bond, a C1-C12 divalent linking group that optionally contains one or more of a halogen atom or a group chosen from ester, ether, ketone and aromatic; $Y_2$ represents a single bond, optionally fluorinated methylene or ethylene, optionally fluorinated phenylene, $-OR_{10^-}$, or $-C(O)Y_3R_{10^-}$, wherein $Y_3$ is oxygen or NH, and $R_{10}$ is a group chosen from straight, branched or cyclic C1-C6 alkylene, phenylene, fluorophenylene, trifluoromethyl-substituted phenylene or alkenylene, which may contain a carbonyl, ester, ether or hydroxyl substituent; Z represents S or I; n is an integer of 0 or 1, provided that when Z is S, n is 1 and when Z is I, n is O.

Suitable exemplary sulfonium and iodonium PAG monomers for use in the photoresist matrix polymer include the following:

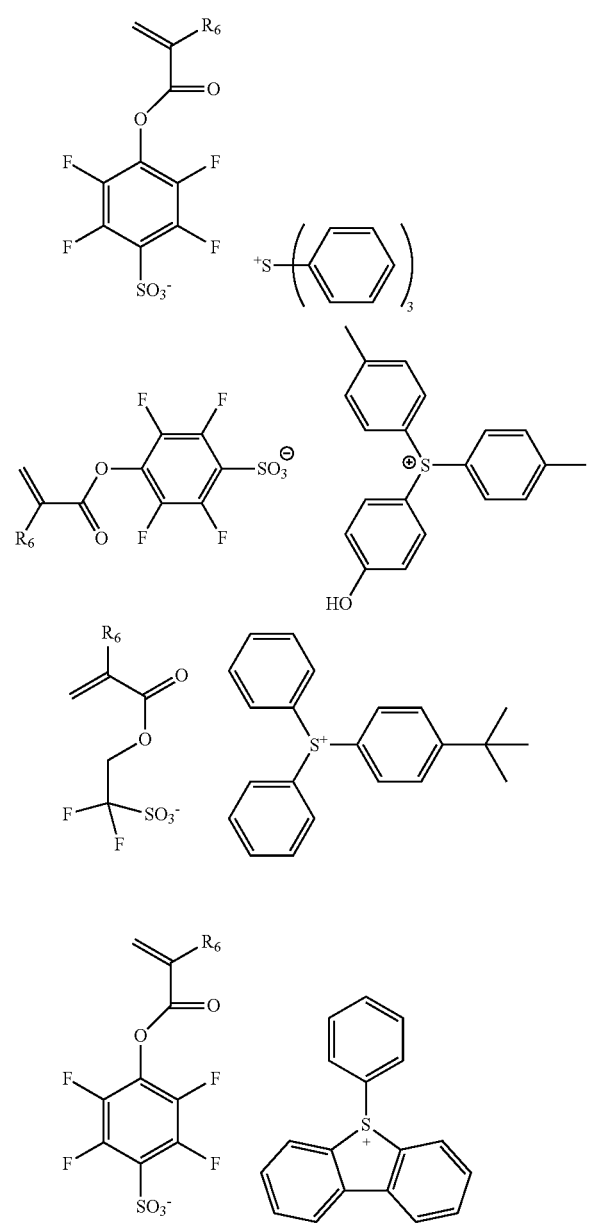
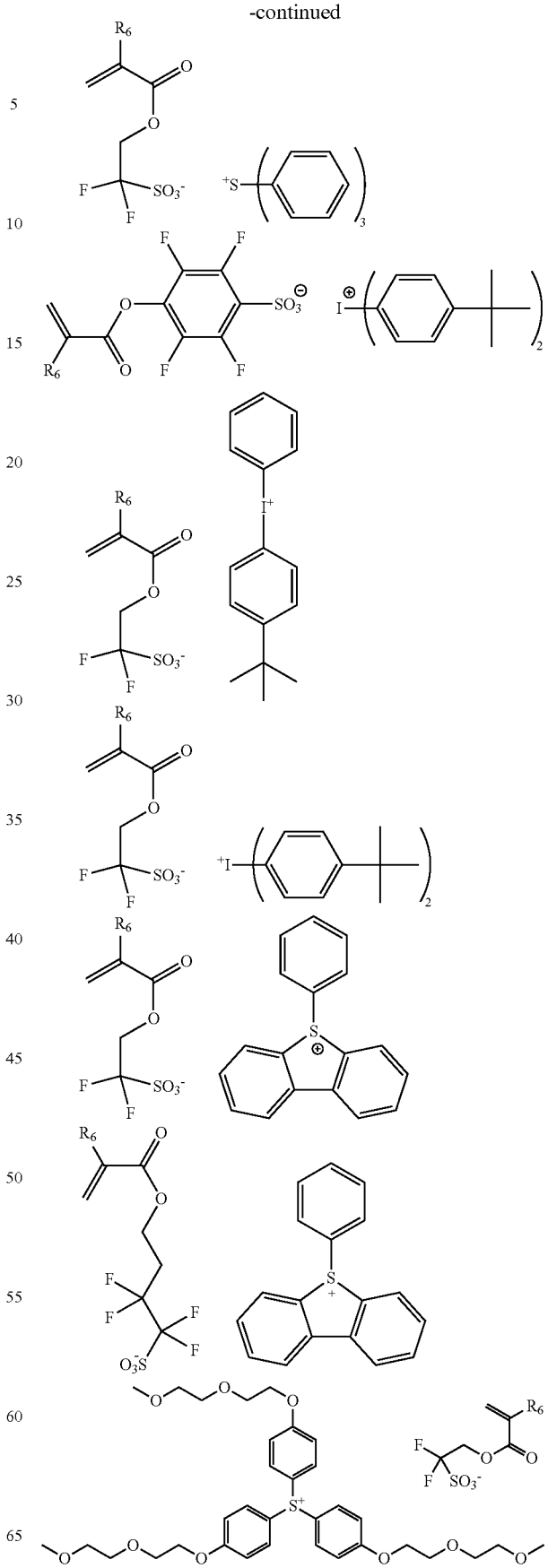

-continued

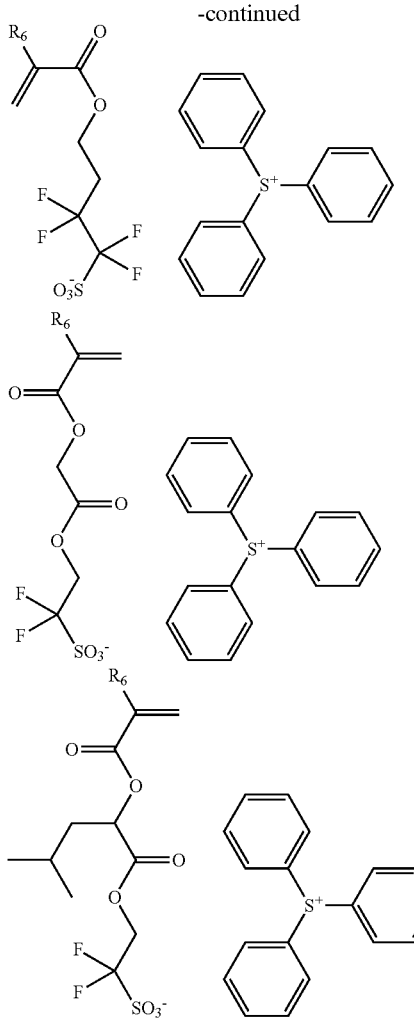

where each $R^a$ is independently H, F, -CN, $C_{1-10}$ alkyl, or $C_{1-10}$ fluoroalkyl.

The matrix polymer may be synthesized using well known free radical polymerization techniques known in the art. For example, the polymer may be synthesized by dissolving the monomers in an organic solvent, adding a radical polymerization initiator thereto, and effecting heat polymerization to form the polymer. Suitable organic solvents that can be used for the polymerization include, for example, toluene, benzene, tetrahydrofuran, diethyl ether and dioxane. Suitable polymerization initiators include, for example, 2,2'-azobisisobutyronitrile (AIBN), 2,2'-azobis(2,4-dimethylvaleronitrile), dimethyl 2,2-azobis(2-methylpropionate), benzoyl peroxide and lauroyl peroxide.

When copolymerizing certain hydroxy aromatic monomers such as hydroxystyrene or hydroxyvinylnaphthalene, an alternative polymerization method may be desired due to the relative instability of such monomers. The polymerization may, for example, take place using protected phenolic hydroxyl groups and subsequently deprotecting the polymer. For example, acetoxystyrene or acetoxyvinylnaphthalene monomers can be used in the polymerization instead of hydroxystyrene or hydroxyvinylnaphthalene. After polymerization, the acetoxy group can then be deprotected by acid or alkaline hydrolysis to convert those units to hydroxystyrene or hydroxyvinylnaphthalene units.

Typically, the copolymer will have a Mw of from 1,000 to 50,000, more typically from 10,000 to 30,000 with a typical polydispersity index (PDI=Mw/Mn) of 3 or less, preferably 2 or less, as measured by GPC versus polystyrene standards.

The preferred resist compositions further comprise an additive photoacid generator that does not form part of the matrix polymer. The additive PAG can be ionic or non-ionic. Suitable additive PAGs are described, for example, in U.S. Pat. No. 7,704,668B1, U.S. Pat. No. 9,182,669B2 and U.S. Pat. No. 6,740,467B2, and also include the following exemplary compounds:

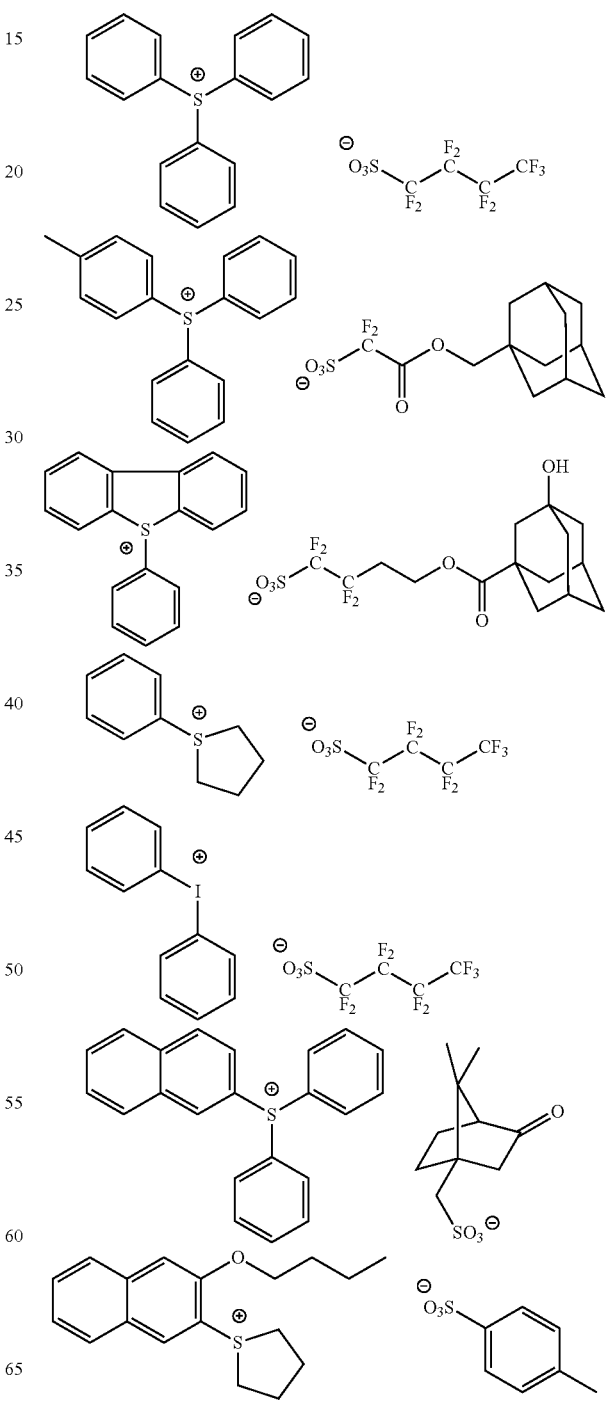

-continued

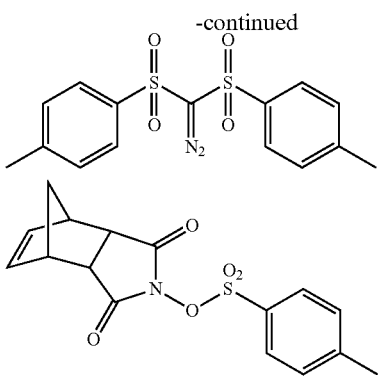

The photoresist compositions can include one or more other optional materials, for example, added bases, surfactants, actinic and contrast dyes, anti-striation agents, plasticizers, speed enhancers and sensitizers. Such optional additives typically will be present in minor concentration in the photoresist compositions except for fillers and dyes which may be present in relatively large concentrations such as, e.g., in amounts of from 5 to 30 percent by weight of the total weight of a resist's dry components.

The photoresist compositions can be prepared following known procedures. For example, the compositions can be prepared by dissolving solid components of the composition in the solvent components. The desired total solids content of the compositions will depend on factors such as the desired final layer thickness. Typically, the solids content of the photoresist compositions is from 5 to 35 wt % based on the total weight of the composition.

Pattern-Formation Methods

Processes in accordance with the invention will now be described with reference to FIG. 1A-G, which illustrates an exemplary process flow for forming a photolithographic pattern in accordance with the invention. While the illustrated process flow describes a patterning process in which a single resist mask is used to transfer the photoresist pattern to the underlying substrate, it should be clear that the method can be used in other lithographic processes, for example, in double patterning processes such as litho-litho-etch (LLE), litho-etch-litho-etch (LELE) or self-aligned double patterning (SADP), as an ion implantation mask, or any other lithographic process where treatment of a photoresist pattern to reduce LWR would be beneficial.

FIG. 1A depicts in cross-section a substrate 100 which may include various layers and features. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102 a hard mask layer 103 and/or a bottom antireflective coating (BARC) 104 over which a photoresist layer 106 is to be coated. Use of a hard mask layer may be desired, for example, with very thin resist layers, where the layers to be etched require a significant etching depth, and/or where the particular etchant has poor resist selectivity. Where a hard mask layer is used, the resist patterns to be formed can be transferred to the hard mask layer 103 which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer can include a single layer or a plurality of layers of different materials. The hard mask layer can be formed, for example, by chemical or physical vapor deposition techniques.

A bottom antireflective coating may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm) or ArF excimer laser light (193 nm). The antireflective coating can comprise a single layer or a plurality of different layers. Suitable antireflective materials and methods of formation are known in the art. Antireflective materials are commercially available, for example, those sold under the AR™ trademark by Rohm and Haas Electronic Materials LLC (Marlborough, Mass. USA), such as AR™ 40A and AR™ 124 antireflectant materials.

A photoresist layer 106 as described herein is formed from a photoresist material, typically a chemically amplified photosensitive composition, comprising a matrix polymer having acid labile groups. The photoresist layer is disposed on the substrate over the antireflective layer 104 (if present). The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the photoresist layer 106 is from about 500 to 3000 Å.

The photoresist layer 106 can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photoresist and thickness. Typical softbakes are conducted at a temperature of from about 90 to 150° C., and a time of from about 30 to 90 seconds.

The photoresist layer 106 is next exposed to activating radiation 108 through a photomask 110 to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions corresponding to regions of the resist layer to be exposed and unexposed, respectively, by the activating radiation. The exposure wavelength is typically sub-400 nm, sub-300 nm, such as 248 nm, 193 nm or an EUV wavelength (e.g. 13.4 or 13.5 nm). The exposure energy is typically from about 10 to 80 mJ/cm$^2$, dependent upon the exposure tool and the components of the photosensitive composition.

Following exposure of the photoresist layer 106, a post-exposure bake (PEB) is typically performed. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds. A latent image defined by the boundary between polarity-switched and unswitched regions (corresponding to exposed and unexposed regions, respectively) is thereby formed.

Figure 1E:
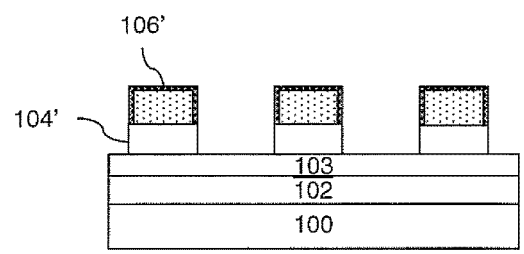
Figure 1B:
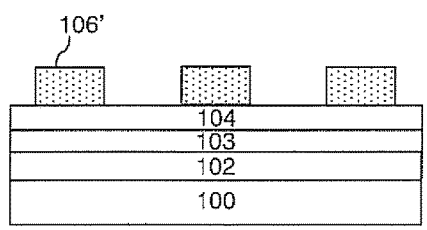

The photoresist layer 106 is next developed to remove exposed regions of the layer, leaving unexposed regions forming a resist pattern 106' having a plurality of features as shown in FIG. 1B. The features are not limited and can include, for example, line, hole and/or post patterns. For positive tone development, the developer is typically an aqueous alkaline developer, for example, a quaternary ammonium hydroxide solution, for example, a tetra-alkyl ammonium hydroxide solutions such as 0.26 Normality (N) (2.38 wt %) tetramethylammonium hydroxide (TMAH).

Figure 1F:
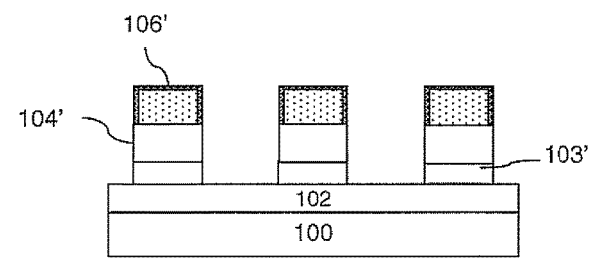
Figure 1C:
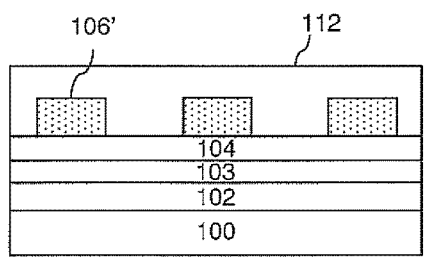

A pattern treatment composition 112 as described herein is applied to the photoresist pattern 106' as shown in FIG. 1C. The pattern treatment composition is typically applied to the substrate by spin-coating, with a coating time of from 30 seconds to two minutes being typical.

Figure 1G:
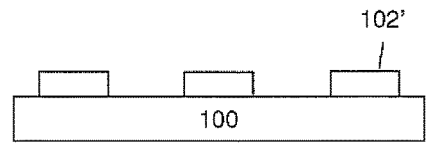
Figure 1D:
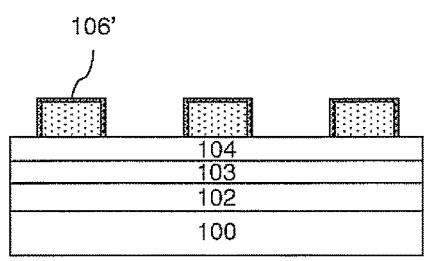

As shown in FIG. 1D, the substrate is next baked to remove solvent from the pattern treatment composition. The inventors have found that application of the pattern treatment composition to the resist pattern can effectively smooth the surface of the resist pattern 106'. The bake can be conducted with a hotplate or oven, with a hotplate being typical. Suitable bake temperatures are greater than 50° C., for example, greater than 70° C., greater than 90° C., greater than 120° C. or greater than 150° C., with a temperature of from 70 to 160° C. and a time of from about 30 to 90 seconds being typical. While a single baking step is typical, multiple-step baking can be used and may be useful for resist profile adjustment.

The photoresist pattern can optionally next be contacted with a rinsing agent to remove residual pattern treatment composition 112 from the wafer surface. The rinsing agent is preferably aqueous-based (i.e., greater than 50 wt % water), for example, DI water optionally containing an additive such as a surfactant, or an aqueous alkaline developer, for a quaternary ammonium hydroxide solution such as a tetra-alkyl ammonium hydroxide solution such as 0.26 Normality (N) (2.38 wt %) tetramethylammonium hydroxide (TMAH). In the case of a water rinse, the rinsing agent typically has a water content of 90 wt % or more, more typically, 95 wt % or more, 98 wt % or more, 99 wt % or more, or 100 wt %, based on the rinsing agent.

Using the resist pattern 106' as an etch mask, the BARC layer 104 is selectively etched to form BARC patterns 104', exposing the underlying hardmask layer 103, as shown in FIG. 1E. The hardmask layer is next selectively etched, again using the resist pattern as an etch mask, resulting in patterned BARC and hardmask layer 103', as shown in FIG. 1F. Suitable etching techniques and chemistries for etching the BARC layer and hardmask layer are known in the art and will depend, for example, on the particular materials of these layers. Dry-etching processes such as reactive ion etching are typical. The resist pattern 106' and patterned BARC layer 104' are next removed from the substrate using known techniques, for example, oxygen plasma ashing. Using the hardmask pattern 103' as an etch mask, the one or more layers 102 are then selectively etched. Suitable etching techniques and chemistries for etching the underlying layers 102 are known in the art, with dry-etching processes such as reactive ion etching being typical. The patterned hardmask layer 103' can next be removed from the substrate surface using known techniques, for example, a dry-etching process such as reactive ion etching or a wet strip. The resulting structure is a pattern of etched features 102' as illustrated in FIG. 1G. In an alternative exemplary method, it may be desirable to pattern the layer 102 directly using the photoresist pattern 106' without the use of a hardmask layer 103. Whether direct patterning with the resist patterns can be employed will depend on factors such as the materials involved, resist selectivity, resist pattern thickness and pattern dimensions.

Figure 2A:
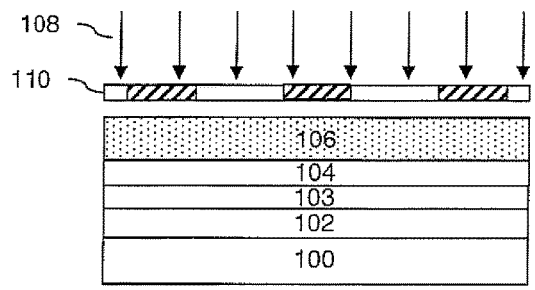
FIG. 2A-J illustrates a second process flow for forming a photolithographic pattern in accordance with the invention.
Figure 2F:
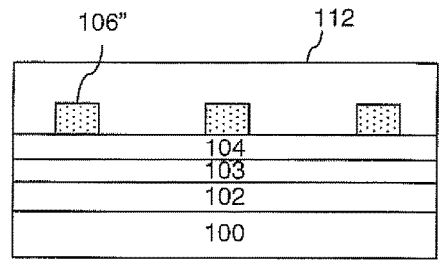
Figure 2B:
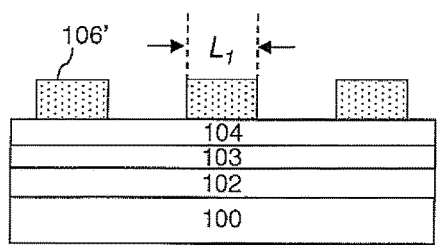
Figure 2G:
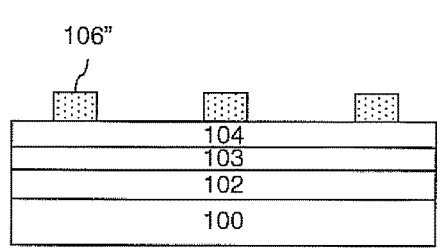
Figure 2C:
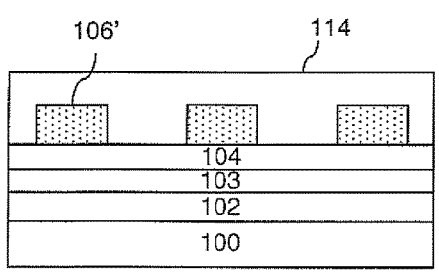
Figure 2H:
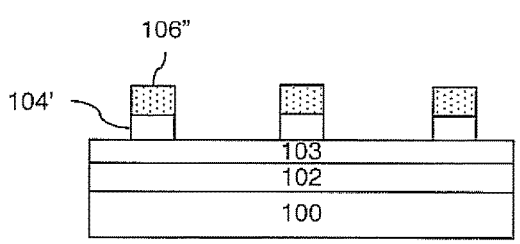
Figure 2D:
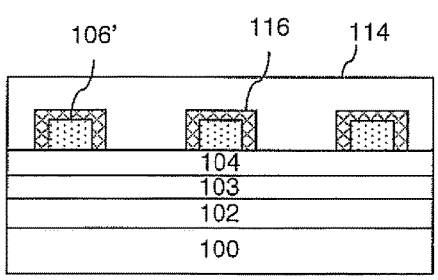
Figure 2I:
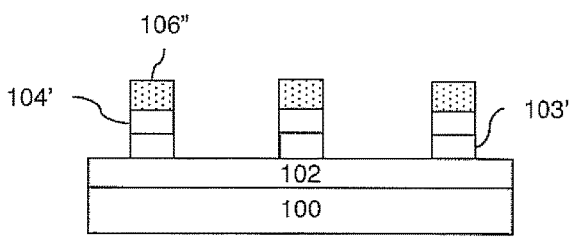
Figure 2E:
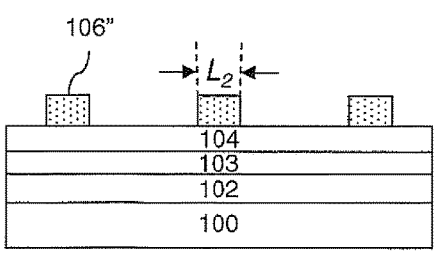

FIG. 2A-H illustrates a further process flow for forming a photolithographic pattern in accordance with the invention. This process is identical to that described above with respect to FIG. 1, except that prior to treatment of the photoresist pattern with the pattern treatment composition 112, the photoresist pattern 106' is subjected to a chemical trim process to reduce the geometry of the resist pattern from dimension $L_1$ as shown in FIG. 2B to $L_2$ as shown in FIG. 2E. More particularly, a layer 114 of a photoresist pattern trimming composition is formed over the photoresist pattern 106' as shown in FIG. 2C. Trimming compositions useful in the invention include a matrix polymer, an acid (polymeric or non-polymeric) or an acid generator, and a solvent, and can include one or more optional additional components. Suitable trimming compositions are known in the art and described, for example, in U.S. Application Pub. Nos. US20140186772A1, US20130171574A1, US20150212414A1, and U.S. Pat. No. 9,209,035B2 and U.S. Pat. No. 9,448,486B2. In addition, polymers, acids, acid generators, solvents and surfactants such as described herein with respect to the pattern treatment compositions can be used in the pattern trimming composition.

The trimming composition is typically applied to the substrate by spin-coating. The solids content of the coating solution can be adjusted to provide a desired film thickness based upon the specific coating equipment utilized, the viscosity of the solution, the speed of the coating tool and the amount of time allowed for spinning. A typical thickness for the pattern trimming layer 114 is from 200 to 1500 Å, typically measured on an unpatterned substrate.

The substrate is next baked to remove solvent in the trimming composition layer and to activate the acid generator, if used. Acid, whether from an acid generator or originally present as a free acid, causes a polarity-changing reaction in the resist pattern surface region 116 as shown in FIG. 2D. The bake can be conducted with a hotplate or oven, with a hotplate being typical. Suitable bake temperatures are greater than 50° C., for example, greater than 70° C., greater than 90° C., greater than 120° C. or greater than 150° C., with a temperature of from 70 to 160° C. and a time of from about 30 to 90 seconds being typical. While a single baking step is typical, multiple-step baking can be used and may be useful for resist profile adjustment.

Figure 2J:
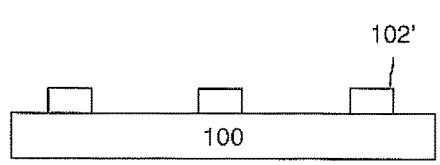

The photoresist pattern is next contacted with a rinsing agent to remove the residual trimming composition layer 114 and the surface region 116 of the photoresist pattern, with the resulting trimmed pattern 106" being shown in FIG. 2E. The post-trim rinsing agent is preferably aqueous-based (i.e., greater than 50 wt % water), for example, DI water optionally containing an additive such as a surfactant, or more typically an aqueous alkaline developer, for example, a quaternary ammonium hydroxide solution such as a tetra-alkyl ammonium hydroxide solution such as 0.26 Normality (N) (2.38 wt %) tetramethylammonium hydroxide (TMAH). In the case of a water rinse, the rinsing agent typically has a water content of 90 wt % or more, more typically, 95 wt % or more, 98 wt % or more, 99 wt % or more, or 100 wt %, based on the rinsing agent. The resist pattern after trimming has a dimension $L_2$ that is smaller as compared with the feature size $L_1$ prior to trimming. The remainder of the patterning-forming method as illustrated in FIG. 2F-J is carried out as described above with reference to FIGS. 1C-1G, respectively, to form the resulting pattern of etched features 102' as shown in FIG. 2J.

The following non-limiting examples are illustrative of the invention.

Examples

Pattern Treatment Composition Preparation

Photoresist pattern treatment compositions were prepared by combining the materials in the amounts set forth in Table 1. The resulting mixtures were shaken on a mechanical shaker and then filtered through a Teflon filter having a 0.2 micron pore size.

Pattern Trimming Composition Preparation

Photoresist pattern trimming compositions were prepared by combining Polymer P-1 (2.93 wt %) with 4-Dodecyl-benzenesulfonic acid (0.06 wt %) and isoamyl ether (97.01 wt %). The resulting mixture was shaken on a mechanical shaker and then filtered through a Teflon filter having a 0.2 micron pore size.

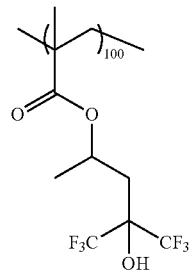

(P-1)

Lithography and Lithographic Evaluation (1)

200 mm silicon wafers coated with a 600 nm BARC layer (Dow Electronic Materials AR™ 3 antireflectant) were spin-coated on a TEL ACT8 clean track with UV™ 217 Photoresist (Dow Electronic Materials) and softbaked at 130° C. for 60 seconds to provide a resist layer thickness of 3550 Å. The wafers were exposed using a Canon FPA 5000 ES4 248 nm DUV scanner (NA=0.68) with conventional illumination (0.75 sigma), using a mask having line and space patterns with binary feature sizes of 140 nm 1:1. The exposed wafers were post-exposure baked at 125° C. for 60 seconds and developed with a 0.26N TMAH solution to form 140 nm 1:1 line and space resist patterns (duty ratio=1:1). Initial CD ($CD_i$) and linewidth roughness ($LWR_i$) of the resist patterns were measured using a Hitachi High Technologies Co. CG4000 CD-SEM. The pattern treatment compositions were then dispensed on the patterned wafers on a TEL ACT8 clean track at 1500 rpm, and were baked at 80° C. for 60 seconds. Some of the wafers were rinsed dynamically with DI water on the clean track for 60 seconds and spin-dried. Final CD ($CD_f$) and LWR ($LWR_f$) of the resist patterns were measured with the Hitachi CD-SEM. The change in CD (ΔCD) and percent reduction in LWR (ΔLWR) were calculated as follows and the results are shown in Table 1:

$$\Delta CD = CD_f - CD_i \quad (1)$$

$$\Delta LWR = 100[(LWR_i - LWR_f)/LWR_i] \quad (2)$$

TABLE 1

| | | Pattern Treatment Composition | | | | | |
|---|---|---|---|---|---|---|---|
| Example | Comp'n | Solvent 1 (wt %) | Solvent 2 (wt %) | Surfactant (wt %) | Water Rinse | ΔCD (nm) | ΔLWR (%) |
| 1 | PTC-1 | TPM (1) | IAE (99) | — | — | 0.2 | 20% |
| 2 | PTC-1 | TPM (1) | IAE (99) | — | Yes | 1.7 | 16% |
| 3 | PTC-2 | DPA (1) | IAE (99) | — | — | 0.7 | 8% |
| 4 | PTC-3 | DPB (1) | IAE (99) | — | — | 0.2 | 10% |
| 5 | PTC-4 | DPG (1) | IAE (99) | — | — | 0.3 | 11% |
| 6 | PTC-5 | TPG (1) | IAE (99) | — | — | -6.3 | 22% |
| 7 | PTC-6 | TPB (1) | IAE (99) | — | — | -0.9 | 18% |
| 8 | PTC-7 | TPM (1) | IAE (98) | Surf. A (1) | Yes | -3.2 | 25% |
| 9 | PTC-8 | TPM (1) | IAE (98.7) | Surf. A (0.3) | Yes | 1.5 | 23% |
| 10 | PTC-9 | TPM (0.5) | IAE (98.5) | Surf. A (1) | Yes | 3.8 | 14% |
| 11 | PTC-10 | TPM (1) | IAE (98.9) | Surf. B (0.1) | — | -2.6 | 15% |
| 12 | PTC-11 | TPM (1) | IAE (98.9) | Surf. C (0.1) | Yes | 1.6 | 15% |
| 13 | PTC-12 | TPM (1) | IAE (98.5) | Surf. D (0.5) | Yes | -4 | 18% |
| 14 | PTC-13 | TPM (1) | IAE (98.5) | Surf. E (0.5) | Yes | -5.7 | 16% |
| 15 | PTC-14 | TPM (1) | IAE (98.5) | Surf. F (0.5) | Yes | -5.6 | 15% |
| 16 | PTC-15 | TPM (1) | IAE (98.5) | Surf. G (0.5) | Yes | 8.8 | 9% |

TABLE 1-continued

| Example | Comp'n | Pattern Treatment Composition | | | | ΔCD (nm) | ΔLWR (%) |
| --- | --- | --- | --- | --- | --- | --- | --- |
| | | Solvent 1 (wt %) | Solvent 2 (wt %) | Surfactant (wt %) | Water Rinse | | |
| Comp. 1 | PTC-16 | — | IAE (100) | — | — | 2.1 | 0 |
| Comp. 2 | PTC-17 | DPM (1) | IAE (99) | — | — | 0.9 | −1% | wt % = weight percent based on total composition; TPM = Tri(propylene glycol) monomethyl ether; DPA = Di(propylene glycol) allyl ether; DPB = Di(ethylene glycol) butyl ether; DPG = Di(propylene glycol); TPG = Tri(propylene glycol); TPB = Tri(propylene glycol) butyl ether; DPM = Di(ethylene glycol) monoethyl ether; IAE = Isoamyl ether; Surf. A = Pentaerythritol ethoxylate (15/4 EO/OH) (SigmaAldrich); Surf. B = Pluronic L31 (BASF Corp.); Surf. C = Surfynol 104 (Air Products); Surf. D = P2000 (The Dow Chemical Company); Surf. E = PT3000 (The Dow Chemical Company); Surf. F = PT700 (The Dow Chemical Company); Surf. G = PT250 (The Dow Chemical Company).

Lithography and Lithographic Evaluation (2)

200 mm silicon wafers coated with a 600 nm BARC layer (Dow Electronic Materials AR™ 3 antireflectant) were spin-coated on a TEL ACT8 clean track with UV™ 217 Photoresist (Dow Electronic Materials) and softbaked at 130° C. for 60 seconds to provide a resist layer thickness of 3550 Å. The wafers were exposed using a Canon FPA 5000 ES4 248 nm DUV scanner (NA=0.68) with conventional illumination (0.75 sigma), using a mask having line and space patterns with binary feature sizes of 140 nm 1:1. The exposed wafers were post-exposure baked at 125° C. for 60 seconds and developed with a 0.26N TMAH solution to form 140 nm 1:1 line and space resist patterns (duty ratio=1:1). Initial CD ($CD_i$) and linewidth roughness ($LWR_i$) of the resist patterns were measured using a Hitachi High Technologies Co. CG4000 CD-SEM.

Some of the wafers were coated at 1500 rpm with the pattern trimming composition described above on a TEL ACT8 clean track, baked at 70° C. for 120 seconds and rinsed with 0.26N TMAH solution for 15 seconds. Pattern treatment compositions were dispensed on some of the patterned wafers on a TEL ACT8 clean track at 1500 rpm, and were baked at 80° C. for 60 seconds. Some of the wafers were rinsed dynamically with DI water on the clean track for 60 seconds and spin-dried. The final CDs ($CD_f$) of the resist patterns were then measured using the Hitachi CD-SEM. The change in CD (ΔCD) and percent reduction in LWR (ΔLWR) are provided in Table 2.

TABLE 2

| Example | Pattern Trim/ TMAH Rinse | Pattern Treatment Composition | | | | ΔCD (nm) | ΔLWR (%) |
| --- | --- | --- | --- | --- | --- | --- | --- |
| | | Comp'n | Solvent 1 (wt %) | Solvent 2 (wt %) | Water Rinse | | |
| 17 | Yes | PTC-1 | TPM (1) | IAE (99) | Yes | 26 | 11 |
| Comp. 3 | — | PTC-1 | TPM (1) | IAE (99) | Yes | 6 | 15 |
| Comp. 4 | Yes | — | — | — | — | 23 | 5 |
| Comp. 5 | — | PTC-16 | — | IAE (100) | — | 2.1 | 0 | wt % = weight percent based on total composition; TPM = Tri(propylene glycol) monomethyl ether; IAE = Isoamyl ether.

What is claimed is:

1. A pattern-formation method, comprising:
   (a) providing a substrate;
   (b) forming a photoresist pattern over the substrate;
   (c) applying a pattern treatment composition to the photoresist pattern, the pattern treatment composition comprising a solvent mixture comprising a first organic solvent and a second organic solvent, wherein the first organic solvent has a boiling point that is greater than a boiling point of the second organic solvent, and wherein the first organic solvent has a boiling point of 210° C. or more; and
   (d) after the applying a pattern treatment composition, heating the photoresist pattern.

2. The pattern-formation method of claim 1, further comprising, after the heating the photoresist pattern, contacting the photoresist pattern with a rinsing agent.

3. The pattern-formation method of claim 2, wherein the rinsing agent is water-based.

4. The pattern-formation method of claim 1, wherein forming the photoresist pattern comprises, prior to the applying a pattern treatment composition:
   (b1) lithographically patterning a photoresist composition layer; and
   (b2) chemically trimming the lithographically patterned photoresist composition layer.

5. The pattern-formation method of claim 1, further comprising, after the heating the photoresist pattern, patterning a layer below the photoresist pattern using the photoresist pattern as a mask.

6. The pattern-formation method of claim 1, wherein the first organic solvent is present in the pattern treatment composition in an amount of from 0.001 to 20wt % based on the solvent mixture.

7. The pattern-formation method of claim 1, wherein the first organic solvent is a glycol ether.

8. The pattern-formation method of claim 7, wherein the first organic solvent is chosen from dipropylene glycol, di(propylene glycol) allyl ether, di(ethylene glycol) monobutyl ether, tripropylene glycol, tri(propylene glycol) monomethyl ether, tri(propylene glycol) monobutyl ether, pentapropylene glycol monomethyl ether, pentapropylene glycol monobutyl ether and combinations thereof.

9. The pattern-formation method of claim 1, wherein the second organic solvent has a boiling point of from 120 to 200° C.

10. The pattern-formation method of claim 1, wherein the second organic solvent is a dialkyl ether having a total carbon number of from 6 to 16.

11. The pattern-formation method of claim 10, wherein the second organic solvent is an alkyl ether or an aryl ether.

12. The pattern-formation method of claim 1, wherein the pattern treatment composition further comprises a surfactant.

13. The pattern-formation method of claim 1, wherein the pattern treatment composition further comprises an acid or an acid generator.

14. The pattern-formation method of claim 1, wherein the pattern treatment composition is free of acids and acid generators.

15. The pattern-formation method of claim 1, wherein the pattern treatment composition is free of non-surfactant polymers.

* * * * *